United States Patent
Watanabe et al.

(10) Patent No.: US 6,486,489 B2
(45) Date of Patent: Nov. 26, 2002

(54) TRANSISTOR

(75) Inventors: Hiroyuki Watanabe, Minamiashigara (JP); Chikara Manabe, Minamiashigara (JP); Taishi Shigematsu, Minamiashigara (JP); Kei Shimotani, Minamiashigara (JP); Masaaki Shimizu, Ashigarakami (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 09/988,146

(22) Filed: Nov. 19, 2001

(65) Prior Publication Data

US 2002/0130333 A1 Sep. 19, 2002

(30) Foreign Application Priority Data

Mar. 16, 2001 (JP) .......................................... 2001-075835

(51) Int. Cl.[7] .............................................. H01L 29/06
(52) U.S. Cl. ........................... 257/9; 257/216; 257/218; 257/414; 205/122
(58) Field of Search .......................... 257/9, 216, 218, 257/255, 297, 373; 205/122, 157, 162, 164

(56) References Cited

PUBLICATIONS

L. Cai et al. "Self–assembled DNA networks and their electrical conductivity" App. Phys. Lett., vol. 77, pp. 3105–3106.

*Primary Examiner*—Hoai Ho
*Assistant Examiner*—Long K. Tran
(74) *Attorney, Agent, or Firm*—Oliff & Berridge, PLC

(57) ABSTRACT

There is provided a transistor, which includes a deoxyribonucleic acid molecule or a deoxyribonucleic acid molecule aggregate as a part of structural materials, has a source electrode member, a drain electrode member and a gate electrode member, in which at least one of three electrode members connects to the deoxyribonucleic acid molecule or deoxyribonucleic acid molecule aggregate.

16 Claims, 10 Drawing Sheets

CURRENT-VOLTAGE CHARACTERISTIC
(CASE OF DISPOSING GATE ELECTRODE ON NANOTUBE)

TRANSISTOR

BACKGROUND OF THE INVENTION

1. Field of the Invention

The present invention relates to a transistor, and in particular, to an extremely small transistor which can correspond to significant reduction in the size of an electronic circuit.

2. Description of the Related Art

There is a limit to the degree of integration of a silicon device which is now widely used in view of its working. If a gate width of a silicon field effect transistor is 100 nm or less, the transistor is considered to be extremely difficult to use industrially. Also, if it is thought that, as a principle, if the gate width of a transistor is 20 nm or less, an operation of the transistor becomes unstable because of a tunnel effect or the like. Accordingly, a molecular device which uses a functional molecule itself such as carbon nanotube, Fullerene or the like is being developed as an electronic device material for replacing silicon.

Meanwhile, a function of deoxyribonucleic acid (which may be appropriately referred to as "DNA" hereinafter) has attracted attention. Deoxyribonucleic acid is a substance which has a double helix structure and is formed of pairs of two bases selected from four kinds of bases including adenine, cytosine, guanine and thymine, on a ribose phosphate chain. A natural DNA has a diameter of around 2 nm and a length of a few meters. DNA exists within nuclei of cells of various organisms. All genetic information is recorded by a DNA sequence. The specific chemical structure of DNA was discovered by Watson and Crick. Thereafter, human genome and enzyme generation has been researched by studying DNA sequence.

Use of DNA as materials for an electronic device has been studied and electric conductivity of DNA especially has attracted attention.

If it is possible to use DNA on an electronic circuit, it is considered that a degree of integration which exceeds that of a conventional silicon device circuit can be accomplished by using DNA as a component of a small circuit. However, an operation example of a DNA transistor has not been reported so far.

SUMMARY OF THE INVENTION

An object of the present invention is to provide extremely small transistor which can correspond to significant reduction in the size of an electronic circuit by using DNA as structural materials. The present invention discloses a transistor comprising a source electrode member; a drain electrode member; a gate electrode member; and a deoxyribonucleic acid molecule or a deoxyribonucleic acid molecule aggregate, wherein at least one of said source electrode member, said drain electrode member and said gate electrode member connects to said deoxyribonucleic acid molecule or deoxyribonucleic acid molecule aggregate.

In the transistor of the present invention, since a deoxyribonucleic acid molecule or a deoxyribonucleic acid molecule is used as a part of structural materials, the transistor can be extremely small, and correspond to significant reduction in the size of an electronic circuit.

There are two aspects of the transistor of the present invention in view of a function of the deoxyribonucleic acid molecule (DNA) or deoxyribonucleic acid molecule aggregate.

(1) An aspect characterized in that DNA or deoxyribonucleic acid molecule aggregate acts as a carrier transporting material, (2) An aspect characterized in that DNA or deoxyribonucleic acid molecule aggregate is in a form of mass to connect to a gate electrode member, and the mass has a function of an insulating material.

In accordance with aspect (1), preferably said electrode members are rod-like shape, and said source electrode member, said gate electrode member and said drain electrode member are arranged in that order in a longitudinal direction of connects of said deoxyribonucleic acid molecule or deoxyribonucleic acid molecule aggregate.

In the aspect (1), preferably said gate electrode member has a portion connecting to said deoxyribonucleic acid molecule or deoxyribonucleic acid molecule aggregate, the portion having a width from 0.1 nm to 100 nm. Further, a gap between a point where said source electrode member connects to said deoxyribonucleic acid molecule or deoxyribonucleic acid molecule aggregate and a point where said drain electrode member connects to said deoxyribonucleic acid molecule or deoxyribonucleic acid molecule aggregate is 1 nm to 100 nm. Preferably, said deoxyribonucleic acid molecule or deoxyribonucleic acid molecule aggregate has a length of 2 nm to 10 $\mu$m. Further, said deoxyribonucleic acid molecule or deoxyribonucleic acid molecule aggregate has 10 or less molecules, and is thread-like or bundle-like.

In accordance with the aspect (1), a transistor of the present invention can operate as a single electron tunneling transistor as well as an ordinary field effect transistor by using DNA.

In accordance with aspect (2), a deoxyribonucleic acid molecule or deoxyribonucleic acid molecule aggregate is disposed so as to contact a carrier transporting material, a gate electrode member contacts a deoxyribonucleic acid molecule or deoxyribonucleic acid molecule aggregate so as not to contact the carrier transporting material, a source electrode member and a drain electrode member connect to the carrier transporting material while sandwiching a deoxyribonucleic acid molecule or deoxyribonucleic acid molecule aggregate therebetween.

In accordance with the aspect (2), a gap between a point where said source electrode member which connects to said carrier transporting material and a point where said drain electrode member which connects to said carrier transporting material is 1 nm to 1 $\mu$m. Further, in the aspect (2), the carrier transporting material is preferably a nanotube. In accordance with the aspect (2), a thickness of the mass of deoxyribonucleic acid molecules or deoxyribonucleic acid molecule aggregate is preferably 2 nm to 100 nm.

In the aspects (1) and (2), the number of bases composing the deoxyribonucleic acid molecule or the deoxyribonucleic acid molecule of the deoxyribonucleic acid molecule aggregate is preferably 2 to 100,000.

In the aspects (1) and (2), because DNA is extremely fine, it is difficult for effective electric wiring to be applied thereto, However, if a carbon nanotube is used for electrode members, it is easy to apply electric wiring to DNA. That is, a carbon nanotube is preferable for the gate electrode, the gate electrode and/or the drain electrode.

DESCRIPTION OF THE PREFERRED EMBODIMENTS

The present invention provides a transistor which includes deoxyribonucleic acid molecule or deoxyribonucleic acid molecule aggregate as a part of structural materials, which has three electrode materials, i.e., source electrode member, drain electrode member and gate electrode member, in which at least one of three electrode members connects to the deoxyribonucleic acid molecule or deoxyribonucleic acid molecule aggregate. The present invention will be described in detail hereinafter with reference to the drawings by considering two embodiments, Embodiment (1) and Embodiment (2).

Embodiment (1)

Embodiment (1) of the present invention is characterized in that deoxyribonucleic acid molecule or deoxyribonucleic acid molecule aggregate acts as a carrier transporting material.

Figure 1:
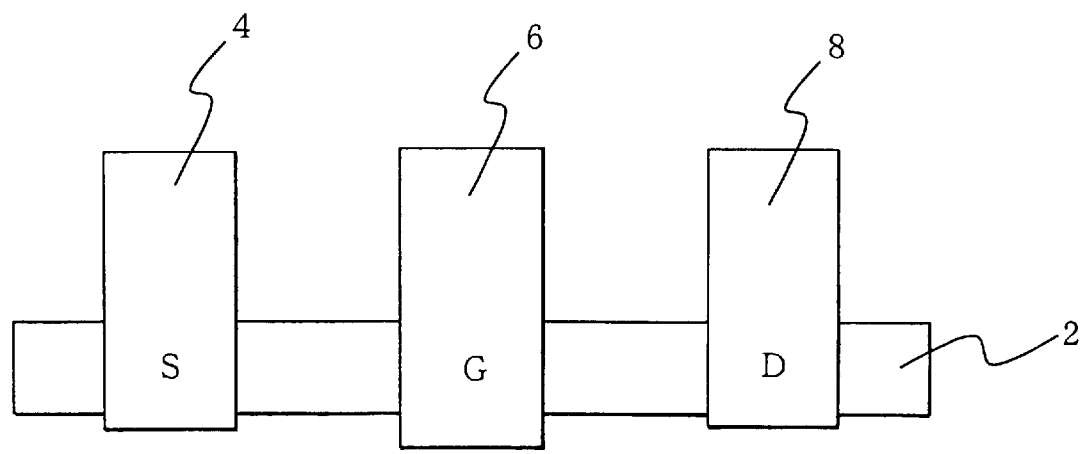
FIG. 1 is a typical structural view of one embodiment of the present invention.

FIG. 1 is a typical structural view of Embodiment (1) of the present invention. In FIG. 1, reference numeral 2 designates deoxyribonucleic acid molecule or deoxyribonucleic acid molecule aggregate (the deoxyribonucleic acid molecule and deoxyribonucleic acid molecule aggregate may be simply referred to as "DNA" hereinafter). Three electrode members, i.e., source electrode member 4, gate electrode member 6 and drain electrode member 8 (from the L left-hand side in FIG. 1) connect to DNA in that order. In this way, a transistor is formed.

The deoxyribonucleic acid molecule (DNA) 2 may be formed of one DNA or may be formed of an aggregate of two or more DNAs. When the DNA 2 is formed of one DNA, it is preferably formed into a fiber form. When the DNA 2 is an aggregate of two or more DNAs, it is preferably formed into a thread-like or a bundle like. Preferably, the number of DNA 2 molecule is 10 or less than 10, and more preferably 5 or less than 5.

A length of the DNA 2 is preferably in a range of 2 nm to 10 μm, and more preferably in a range of 3 nm to 50 nm. In particular,. if a resultant transistor is to function as a single electron tunneling transistor, a length of the DNA 2 is desirably in a range of 4 nm to 10 nm.

As described above, DNA is a substance which has a double helix structure and is formed by pairs of two bases selected from four bases including adenine, cytosine, guanine and thymine and ribose phosphate chain. In Embodiment (1), sequences of such bases are not restricted. In the DNA 2, the number of bases for composing DNA is preferably 2 to 100,000, and more preferably 10 to 300.

The DNA 2 may be a natural DNA extracted from various natural biological resources or may be an artificial DNA that is synthesized chemically, Further, the DNA 2 may be one obtained by cutting, bonding, modifying, realigning, and recombining natural DNA.

If natural DNA is used, it is desirable to purify the natural DNA, because impurities such as protein and the like are usually comprised in the natural DNA. A specific method of DNA purification will be described below. The following method is only D an example, and various conditions (particularly specific numeric values) and procedures can be changed appropriately.

Firstly, protein which is an impurity is removed from DNA with ethanol.

Next, the DNA is washed with a buffer solution (sodium chloride: 300 mmol/L, sodium carbonate: 10 mmol/L, EDTA: 5 mmol/L) to remove impurities. If DNA with higher purity is desired, it is desirable to isolate the DNA by electrophoresis.

After washing the DNA with a buffer solution, the DNA is dispersed in a mixed solution of ethanol and water (ethanol: 20% by weight; water: 80% by weight) in order to remove salts. It is preferable to use ethanol which is distilled before being filtered by a filter with pores having a diameter of 0.1 μm. Further, it is preferable to use ultrapure water (having a resistance value of 18 MΩ or more). Unnecessary salts are removed from the DNA for two or three times by using the mixed solution of ethanol and water so that a density of the DNA is adjusted to 0.01% to 0.1%.

DNA molecules apt to cohere together and become a block during the above-described process for removing impurities. Accordingly, it is preferable to keep the resultant DNA in the mixed solution of ethanol and water for 1 to 10 days in order to expand DNA molecules. A temperature for keeping DNA is preferably 2° C. to 10° C. For example, if DNA is kept at 7° C., the DNA will expand completely into a fiber form for around 7 days.

The order in which the source electrode member 4, the gate electrode member 6 and the drain electrode member 8 connect to the DNA 2 may be reversed from right to left. That is, in the present invention, the phrase "the source electrode member, the gate electrode member, and the drain electrode member arranged in that order in a longitudinal direction of DNA" means that the source electrode member, the gate electrode member and the drain electrode member connect to DNA in that order regardless of which end of the DNA in a longitudinal direction thereof is considered as a reference.

A width of a contact portion of the gate electrode member 6 with the DNA 2 is preferably 0.1 nm to 100 nm, more preferably 0.5 nm to 20 nm, and most preferably 1 nm to 15 nm. Since the width of the contact portion of the gate electrode member 6 can be made narrow, a gap between a point where the source electrode member 4 connects to the DNA 2 and a point where the drain electrode member 8 connects to the DNA 2 can be also made narrow. (The gate electrode member 6 is disposed between the source electrode member 4 and the drain electrode member 8.) Reasons why the space is preferably made narrow are described in the following (1).

In Embodiment (1) of the present invention, when electrode wires are disposed on the DNA 2, as shown in FIG. 1, it is desirable to connect independently conductive thin lines (needle-like lines) to the DNA 2. Reasons for connecting the conductive thin lines independently will be described below.

When DNA is used as an electronic device, there are three problematic points.

(1) As a diameter of DNA is small, for example, 2.3 nm, it is difficult for electric current to flow through the DNA. Thus, electric 1 resistance is increased. If a space between the source electrode and the drain electrode is large, an operation of DNA as a transistor device cannot be expected. Accordingly, in order to realize a transistor which utilizes DNA as a carrier transporting material, it is desirable to make a space between the source electrode and the drain electrode as narrow as possible. In accordance with research by the present inventors, if a gap between the source electrode and the drain electrode is narrower than 50 nm, electric current of 0.1 nA to 10 nA can be applied to DNA.

(2) Of the materials used for electrode members which connect to DNA (in particular, a source electrode member and a drain electrode member), none is an inorganic material which enables ohmic connection to DNA. Thus, at portions of the source electrode member and of the drain electrode member which connect to DNA, widths of portions of electrode members which connect to DNA need to be same, and Shottky connection needs to be carried out with two substantially equal Schottky barriers, (3) As described in (1), it is desirable to make a gap between the source electrode and the drain electrode as narrow as possible (for example, as described above, less than 50 nm). Thus, it is t necessary to make a width of the gate electrode member which is disposed between the source electrode member and the drain electrode member narrower than the space between the source electrode and the drain electrode.

As a method for wiring fine electrodes, in general, DNA is exposed to light by a photo-exposure method or an electronic beam exposure method, and resist-developed. Then metallic wires are disposed thereon. However, in a case of using an organic material such as DNA, an organic solvent cannot be used in resist-development. In the photo-exposure method, it is impossible to wire electrodes having a diameter of 100 nm or less which is a diffraction limit of ultraviolet light. In the electronic beam exposure method, it is difficult technically to wire electrodes having a diameter of 10 nm or less because of an interference effect of electronic lines.

As described above, it is not preferable to wire electrodes on a DNA molecule having a diameter of 2.3 nm by carrying out wiring on a substrate with an exposure technique. Accordingly, in order to wire electrode on a DNA molecule, it is desirable to connect independently conductive fine lines (needle-like lines) to DNA as described above.

As materials for the source electrode member 4, the gate electrode member 6 and the drain electrode member 8 (which may be referred to as "electrode members" hereinafter), any materials such as ordinary metallic wires, gold, platinum, copper, chromium, titanium and the like may be used. To effect wiring on an extremely small material such as DNA, a carbon nanotube (which is simply referred to as "nanotube" hereinafter) is preferably used.

A nanotube is a carbon material and is a rod-like substance having a structure such that graphite is formed in a closed cylindrical shape. There are two kinds of structures of the nanotube, i e., a multi-wall structure and a single wall structure. A nanotube having either structure may be a nanotube which exhibits a semiconductor characteristic or a nanotube which exhibits a conductor characteristic. Either a nanotube having the multi-wall structure or a nanotube having the single-wall structure can be used for electrode members. As a diameter of nanotube is extremely small, it is preferable to use a nanotube to connect to fine lines such as DNA. A nanotube is generally manufactured by an arc discharge method, a laser ablation method or a chemical vapor growth method or the like.

A diameter of nanotube used as electrode members is preferably 0.1 nm to 100 nm, more preferably 0.5 nm to 20 nm, and most preferably 1 nm to 15 nm. In particular, as described above, a width of the gate electrode member 6 is desirably narrow. Thus, a nanotube having a smaller diameter is preferably used. Specifically, a diameter of nanotube is desirably smaller than a space between the source electrode member 4 and the drain electrode member 8. For example, if the space is 10 nm or less, a nanotube having a single wall structure and a diameter of 0.5 nm to 2 nm is desirably used.

A gap between a point where the source electrode member 4 connects to the DNA 2 and a point where the drain electrode member 8 connects to the DNA 2 (which may be referred to as "source-drain distance" hereinafter) is preferably 100 nm or less, and more preferably 50 nm or less. The space is preferably as narrow as possible in order to apply a large amount of electric current between the electrodes. When an extremely fine single wall nanotube is used for the gate electrode member 6, the nanotube has a diameter of 0.5 nm to 2 nm and DNA has a diameter of 2.3 nm. Accordingly, the source-drain distance is preferably 1 nm or more and more preferably 2 nm or more.

In general, a source-drain distance is desirably 5 nm to 20 nm. In order to realize a field effect transistor, the distance of 15 nm to 20 run is most desirable.

Figure 2:
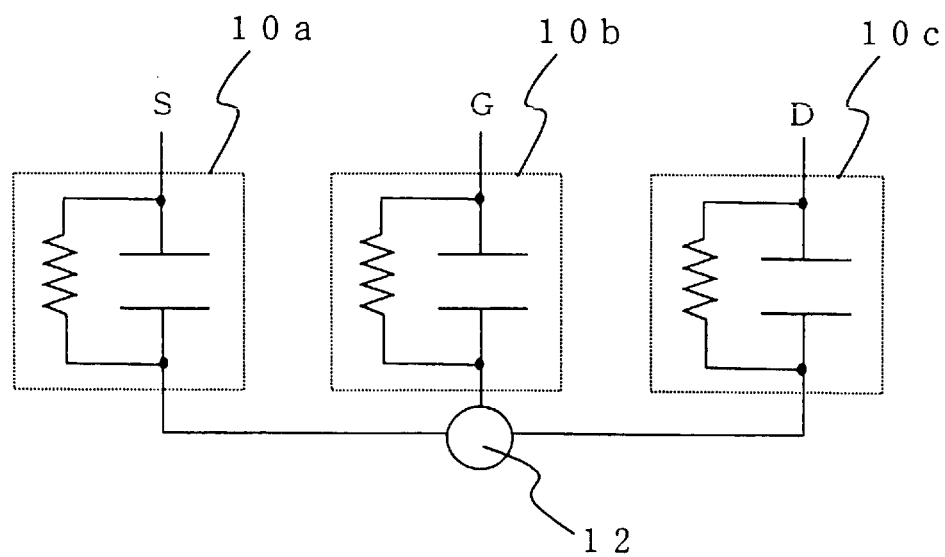
FIG. 2 is an equivalent circuit of a single electron tunneling transistor which can be accomplished by the present invention.

In Embodiment (1), a transistor may be manufactured which is not an ordinary field effect transistor, but rather functions as a $ single electron tunneling transistor which utilizes a coulomb blockade phenomenon by making a source-drain distance as short as possible. Here, the single electron tunneling transistor refers to i as a transistor which can effect a switching operation due to a coulomb blockade phenomenon. FIG. 2 shows an equivalent circuit of a single electron tunneling transistor.

A single electron tunneling transistor is structured such that three small capacitors 10a, 10b and 10c accumulate electric charges and cause tunneling. That is, electric current which flows between a source electrode S and a drain electrode D is controlled in a carrier transporting material 12 by a gate voltage which is applied from a gate electrode G via a coulomb island due to a coulomb blockade phenomenon in which controls tunneling electric current is controlled by one electric charge being accumulated in each of the small capacitors 10a, 10b and 10c. As a result, the single electron transistor has a switching operation.

In order for the transistor in Embodiment (1) to function as a single electron tunneling transistor, a source-drain distance is preferably 1 nm to 50 nm, more preferably 2 nm to 10 nm, and most preferably 4 nm to 8 nm.

In general, it is difficult for a single electron tunneling transistor to operate at room temperatures due to an effect of heat fluctuation. However, since a single electron tunneling transistor of the present invention has a small capacitor formed of a DNA structure of about 1 aF (a=$10^{-18}$), it is possible to operate at room temperatures.

An angle at which the respective electrode members connect to the DNA 2 is not particularly restricted. As shown in FIG. 1, the electrode members may connect to the DNA 2 such that the electrode members cross the DNA 2 in a longitudinal direction of the DNA 2 (The electrode members may cross the DNA 2 perpendicularly or may cross at a predetermined angle.) Further, the electrode members may connect to the DNA 2 such that distal ends of the electrode members contact the DNA 2. Alternatively, the electrode members may connect to the DNA 2 along a longitudinal direction of the DNA 2. Here, since the gate electrode member 6 must be disposed in a gap between a point where the source electrode member 4 connects to the DNA 2 and a point where the drain electrode member 8 connects to the DNA 2, the gate electrode member 6 connects to the DNA 2 such that the gate electrode member and the DNA 2 cross with each other in a L longitudinal direction of the DNA 2, or a distal end of the gate electrode member 6 contacts the DNA 2.

Portions where the respective electrode members connect to the DNA 2 may be bonded by desired means or without using any special means. In particular, when a nanotube is used for electrode members, it seems to be considered that a surface condition of the DNA 2 may change when a nanotube contacts with the DNA 2. Thus, the nanotube and the DNA 2 are bonded securely without glue or soldier. It is desirable to use a nanotube as electrode members in viewed of easy wiring of electrodes.

The above-described transistor of Embodiment (1) of the present invention shown in FIG. 1 can be fabricated in a manner that while the DNA 2 is held on an appropriate retaining substrate, the respective electrode members are wired on the DNA 2.

As a retaining substrate for holding DNA, an insulating substrate having higher electric resistance than that of DNA is used. Examples of the retaining substrate include an ultra-thin silicon oxide film silicon substrate, a sapphire single crystal substrate or a mica substrate. Among such substrates, a sapphire single crystal P substrate or a mica substrate which has a flat surface with respect to the arrangement of the atoms appropriate.

A description will be given of an example of fabricating a transistor of Embodiment (1) of the present invention with a retailing substrate for holding DNA obtained in such a manner that a silicon oxide film is grown on a single crystal silicon substrate (100) to a thickness of 3.5 nm, as an example. This fabrication example is only an example, and the present invention is not limited thereto.

Growth of a silicon oxide film on a single crystal silicon (100) substrate is carried out by an ultrahigh vacuum chemical phase method so as to form a ultra-thin film layer. Materials for the growth are monosilane and an oxygen radical. A degree of vacuum during growth is $2.66 \times 10^{-6}$ Pa ($2 \times 10^{-8}$ Torr). A temperature for growth is set at 420° C., and a speed of growth is 0.12 nm/sec.

A DNA molecule which has been expanded as described above is disposed on the resultant silicon oxide film of the retaining substrate. A needle-like material such as a nanotube or the like is connected at both sides of the DNA molecule as a source electrode member and a drain electrode member. Then, the needle-like material such as a nanotube or the like is connected as a gate F electrode between the source electrode member and the drain electrode member. As a result, a transistor of Embodiment (1) of the present invention can be fabricated.

Embodiment (2)

In Embodiment (2), deoxyribonucleic acid molecule or deoxyribonucleic acid molecule aggregate in a form of mass to connect to gate electrode member, and acts as an insulating material.

Figure 3:
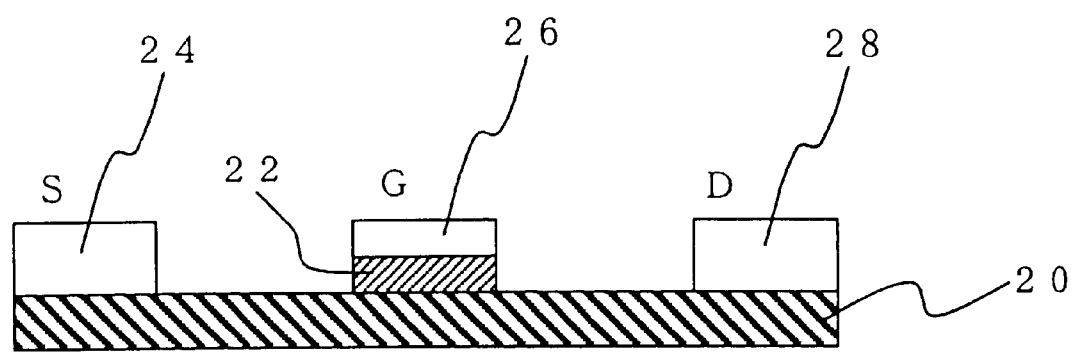
FIG. 3 is a typical structural view of another embodiment of the resent invention.

FIG. 3 shows a typical structural view of Embodiment (2) of the present invention. In FIG. 3, reference numeral 20 designates a carrier transporting material. A block of deoxyribonucleic acid molecule (DNA) 22 is disposed on the carrier transporting material 20 and contacts it. A gate electrode member 26 connects to the DNA 22 not so as to contact the carrier transporting member 20. A source electrode member 24 and a drain electrode member 28 are disposed at both sides of the DNA 22 with the gate electrode member 26 being disposed therebetween. In this way, a transistor is formed. A strong depletion layer is formed in the carrier transporting material 20 because of the existence of the DNA 22 such that the transistor acts as a field effect transistor.

The same DNA as in Embodiment (1) of the present invention F is used as the DNA 22. The DNA 22 is formed with a number of bases being aligned or is formed of an aggregate of DNA. As a whole, the DNA 22 is made in a block. The DNA 22 is preferably in a form of mass so as to connect to the gate electrode member 26 without contacting the carrier transporting material 20, A thickness of the DNA 22 is preferably 2 nm to 100 nm and more preferably 5 nm to 30 nm.

A nanotube, silicon, gallium arsenide, indium phosphide, gallium nitrate or the like may be used for the carrier transporting material 20. It is desirable to use a nanotube in view of the fact that a strong depletion layer is formed due to existence of the DNA 22. A size of a nanotube used for the carrier transporting material 20 is not particularly restricted, but in general, a length of the nanotube is between 5 nm and 10 $\mu$m, and a diameter thereof is between 0.5 nm and 30 nm. Either a nanotube having a multi-wall structure or a nanotube having a single wall structure can be used.

A nanotube is desirably used for the gate electrode member 26, the source electrode member 24 and the drain electrode member 28. As described in Embodiment (1), by using a nanotube for the electrode members, wiring of electrodes can be carried out precisely and easily on a transistor of Embodiment (2) which includes DNA as a part of structural materials. The same nanotube as in Embodiment (1) can be used.

A width of a contact portion of the gate electrode member 26 connects to the DNA 22 is desirably 0.1 nm to 100 nm, and more desirably 1 nm to 10 nm. Due to the width of the gate electrode member 26 with the above-described ranges, a field intensity of the gate is increased, an inversion layer is formed in the carrier transporting portion (nanotube), and thus a switching operation can be expected.

A gap between the source electrode member 24 connecting to r the carrier transporting material 20 and the drain electrode member connecting to the carrier transporting material 20 (i.e., a source-drain distance) is preferably 1 nm to 1 $\mu$m, and more preferably 5 nm to 100 nm. As the source-drain distance is in the above-described ranges, an electric current value between the source and the drain is increased, and an SN ratio in an operation of if the transistor is also increased.

An angle at which the electrode members connect to the carrier transporting material 20 or an angle at which the electrode members connect to the DNA 22 is the same as in Embodiment (1), Bonding of connect toting portions is also the same as in Embodiment (1).

The above-described transistor of Embodiment (2) of the present invention shown in FIG. 3 can be fabricated in such a manner that the carrier transporting material 20 such as a nanotube is held on a surface of an appropriate retaining substrate, a block of the DNA 22 is disposed on the carrier transporting material 20 so as to contact it, and electrode members are wired thereon.

EXAMPLES

Examples of the present invention will be described hereinafter, but the present invention is not limited to these examples.

Example 1

In Example 1, DNA that was taken from sperm of a natural salmon was used. In order to remove impurities such as protein and the like from the DNA, 10 mg of crude-extracted DNA was dispersed in 10 ml of ethanol (99.9% by weight). The resultant mixture was stirred at room temperature for 30 minutes and filtered by a PTFE filter with pores having a diameter of 1 $\mu$m. This operation was repeated three times. Then, the resultant DNA from which protein had been removed was dispersed in 100 ml of a buffer solution (sodium chloride: 300 mmol/L, sodium carbonate: 10 mmol/L, EDTA: 5 mmol/L). Ultrapure water (resistance value: 1.83 M$\Omega$) was used for preparing the buffer solution. The resultant mixture was stirred at room temperature for 30 minutes and filtered by a polytetrafluoroethylene (PTFE) filter with pores having a diameter of 1 $\mu$m. Thus, impurities were removed from the DNA.

Next, in order to remove salts from the DNA, the DNA was dispersed in a mixed solution of ethanol and water (ethanol: 20 % by weight, water: 80% by weight), Ethanol which was distilled before being filtered by a filter with pores having a diameter of 0.1 $\mu$m was used. Ultrapure water (resistance value: 18.3 M$\Omega$) was used. After being subjected to dispersion, the resultant material was shaken for 10 minutes and isolated by centrifugation (number of revolutions: 300 rpm, rotating time: 1 hour). The process was repeated three times, and finally the DNA density was adjusted to 0.02% by weight.

Finally, in order to disperse the DNA molecule aggregate, the DNA molecules were kept in a mixed solution of ethanol and water (ethanol: 20% by weight, water: 80% by weight) for 7 days (expansion treatment). After carrying out the expansion treatment it was confirmed that DNA molecules were expanded into fiber form. One DNA molecule was extracted from the obtained fiber-form DNA and used to fabricate the following transistor. There were 200 of the bases which form the DNA molecule. The DNA molecule had a diameter of 2.3 nm, and a length of 65 nm.

A retaining substrate for holding DNA which was fabricated in such a manner that a silicon oxide film was grown on a single crystal silicon (100) substrate to a thickness of 3.5 nm was used. The specific method of fabricating the retaining substrate was as described above. While a DNA molecule was held on a silicon oxide film of the surface of the retaining substrate, wiring was carried out by using nanotubes as electrode members. A nanotube described below was fabricated by an arc discharge method.

In order to connect wires made of nanotube to a DNA molecule, a triple-probe atomic force microscope (which will be referred to as "T-AFM" hereinafter) was used. A T-AFM is an apparatus which was applied practically as an AFM, had three electrically independent probes, and could treat samples and carry out electric measurement with precision of a nanometer order. In Example 1, probes made of a nanotube (nanotube probes) were connected to DNA, and a current-voltage characteristic was measured by a T-AFM. Specific processes are as follows.

Firstly, a target DNA molecule was observed, and positions on the DNA molecule were determined. Then, while a single wall nanotube which would become a gate electrode member (having a diameter of 1.5 nm, that is, the width of the gate electrode member was 1.5 nm) was moved with a T-AFM, the single wall nanotube was made to cross and connect to a DNA molecule such that a gate electrode was formed. Subsequently, two multi-wall nanotubes (having a diameter of 8 nm) which would become a source electrode member and a drain electrode member respectively were made to be close to a position at which the DNA molecule connect toted against the gate electrode member, with a predetermined distance between the two nanotubes which would become the source electrode member and the drain electrode member respectively being maintained, A distance between the two multi-wall nanotubes became a distance between a source electrode and a drain electrode. In Example 1, the gap was 20 nm, 10 nm, and 5 nm. Finally, two nanotubes were made to connect to the DNA molecule so as to sandwich the position at which the gate electrode member connect toted against the DNA molecule. As a result, a source electrode and a drain electrode were formed. Thereafter, two multi-wall nanotubes which became the source electrode member and the drain electrode member were cut away from a T-AFM. Thus, a transistor of Example 1 was fabricated.

Figure 4:
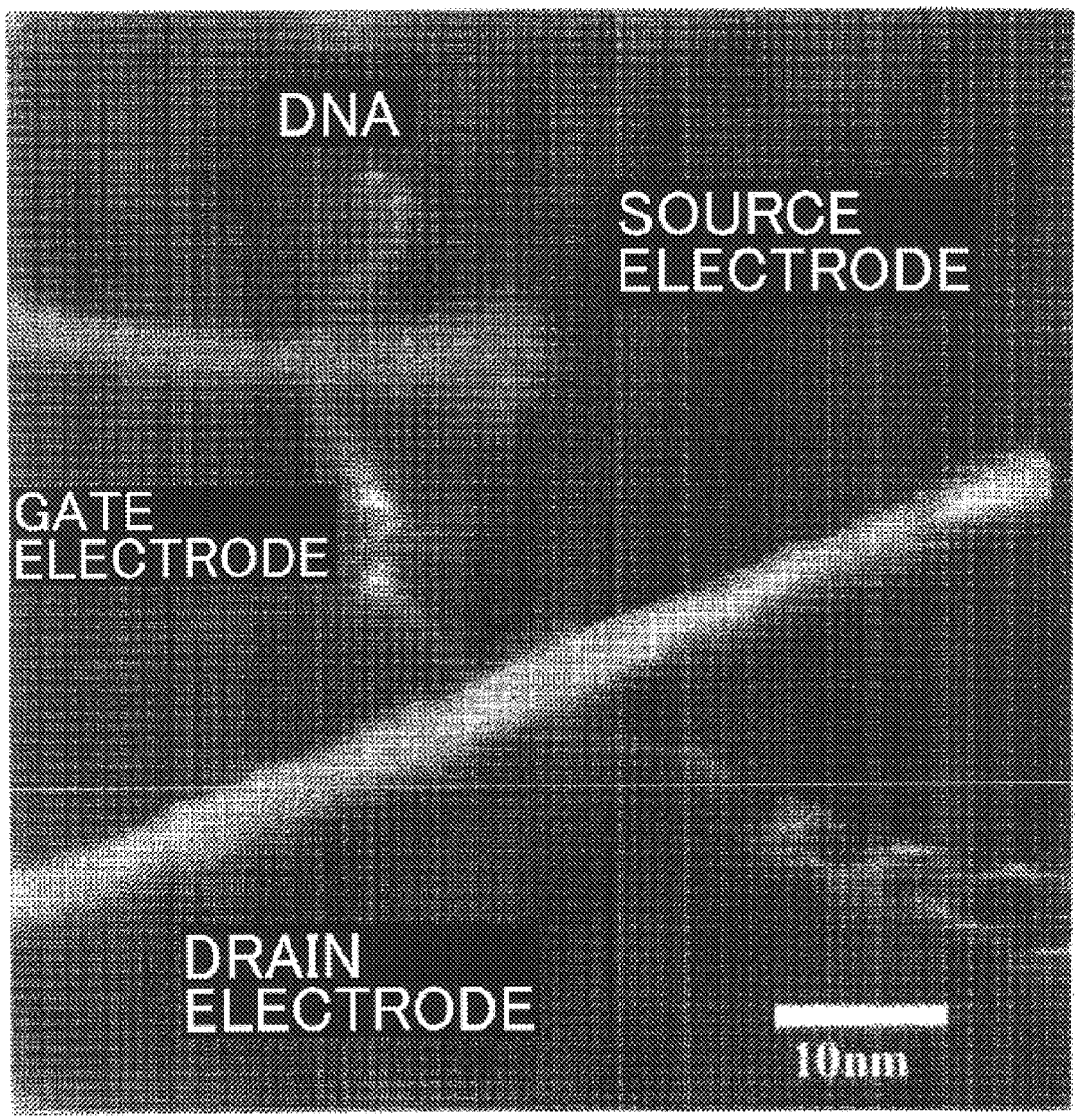
FIG. 4 is an observed AMF image (photograph) of a transistor of Example 1.
Figure 5:
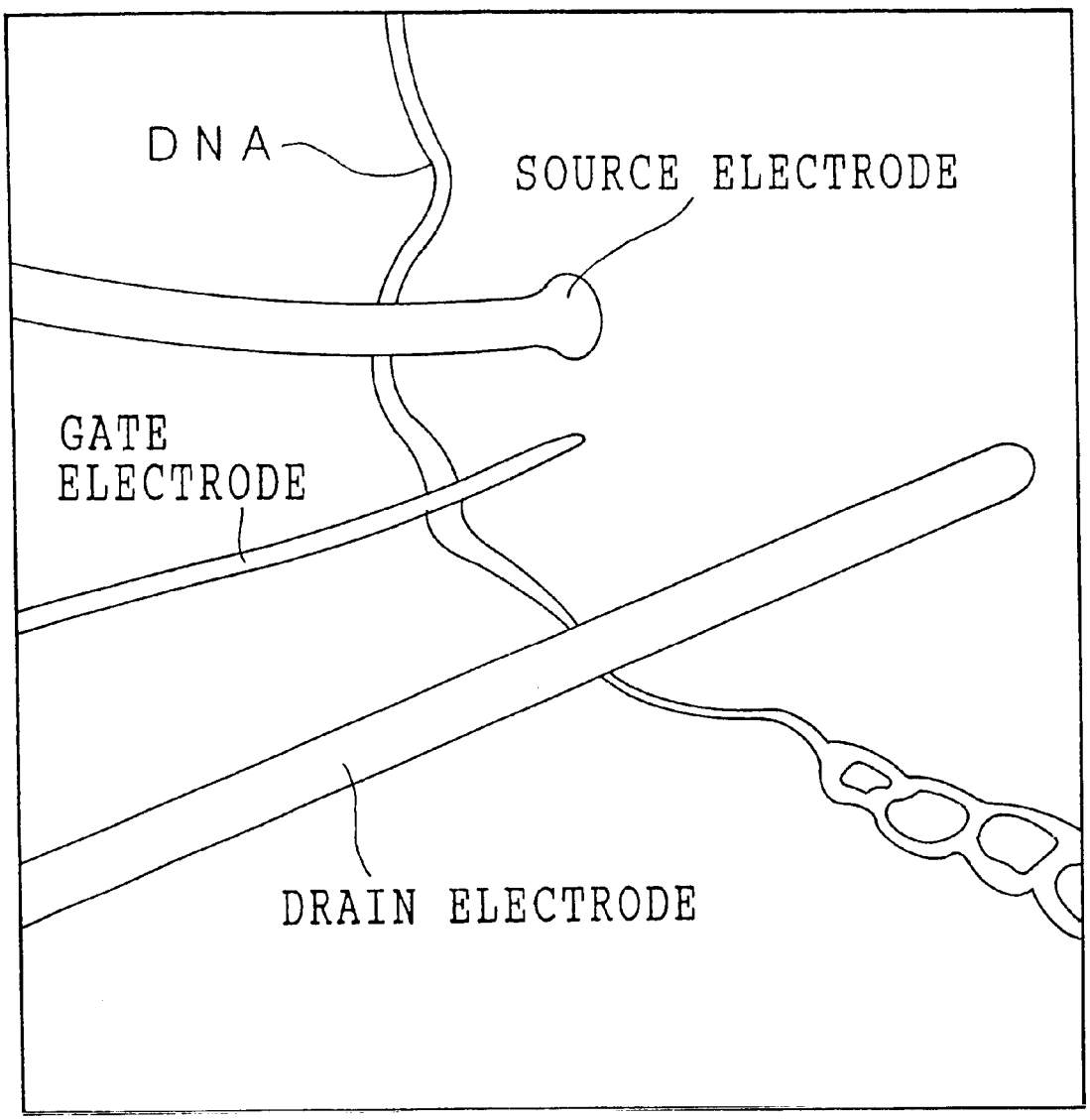
FIG. 5 is a typical explanatory view of FIG. 4, typifying the AMF image (photograph) of FIG. 4.

FIG. 4 shows an AFM image (photograph) of an observed transistor of Example 1. FIG. 5 shows a view typifying FIG. 4. As shown in FIGS. 4 and 5, a source electrode, a drain electrode and a gate electrode are connected to DNA. FIGS. 4 and 5 show a transistor i with a distance between the source electrode and the drain electrode of 20 nm.

Figure 6:
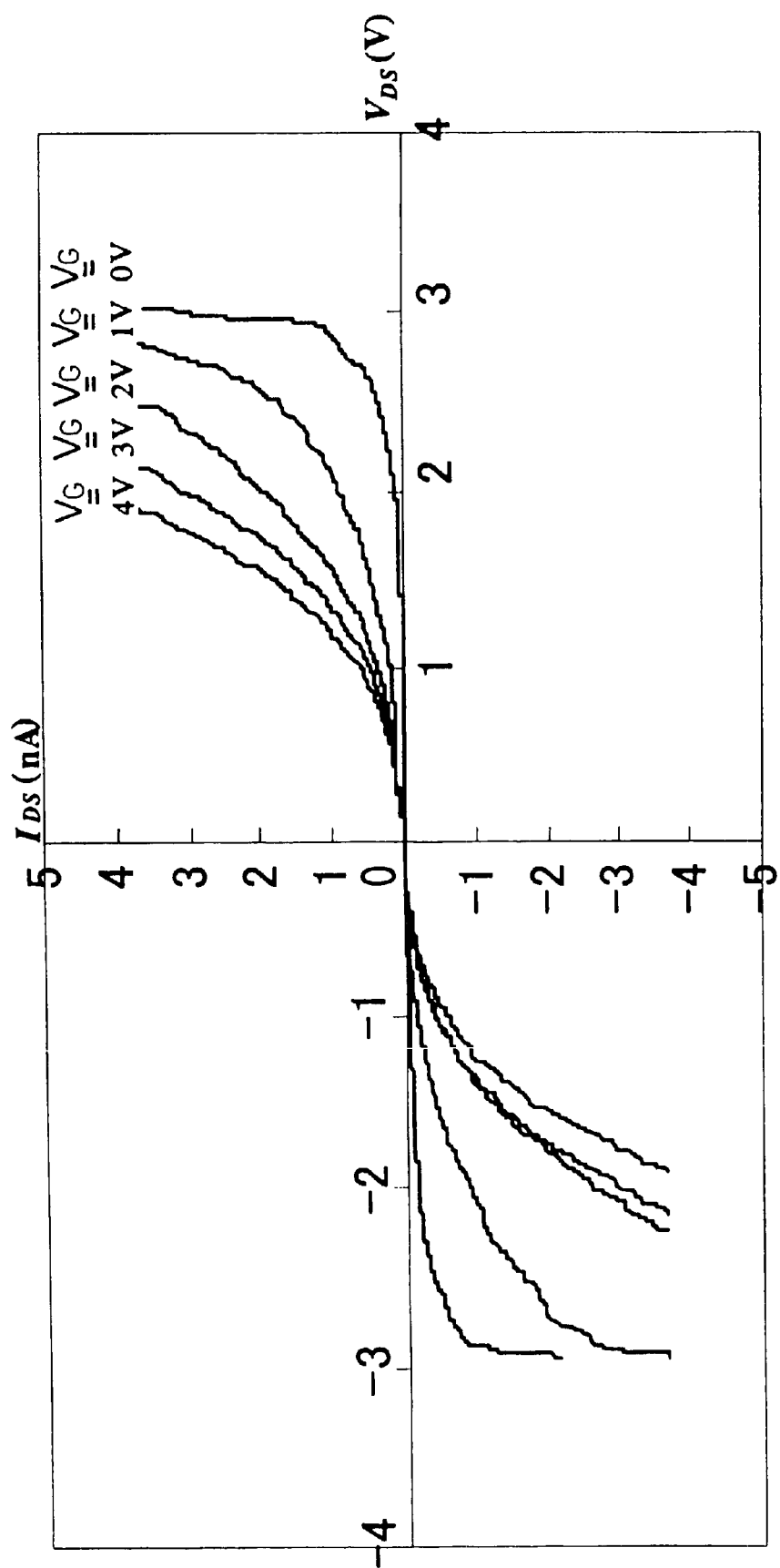
FIG. 6 is a graph showing a current-voltage characteristic between a source and a drain with respect to transistors of Example 1 with a gate voltage varying in a range of 0V to 4V.

With respect to a resultant transistor, voltage was applied to a gate electrode, and a current-voltage characteristic between a source and a drain was measured. FIG. 6 shows a graph of a current-voltage characteristic between a source and a drain with gate voltage being varied in a range of 0V to 4V. A transistor having 20 nm of a distance between a source electrode and a drain electrode was used. Measurement was carried out at room temperature and in dry nitrogen. If gate voltage varied, a current-voltage characteristic also varied. Thus, it was found that a transistor having a switching function was fabricated.

Figure 7:
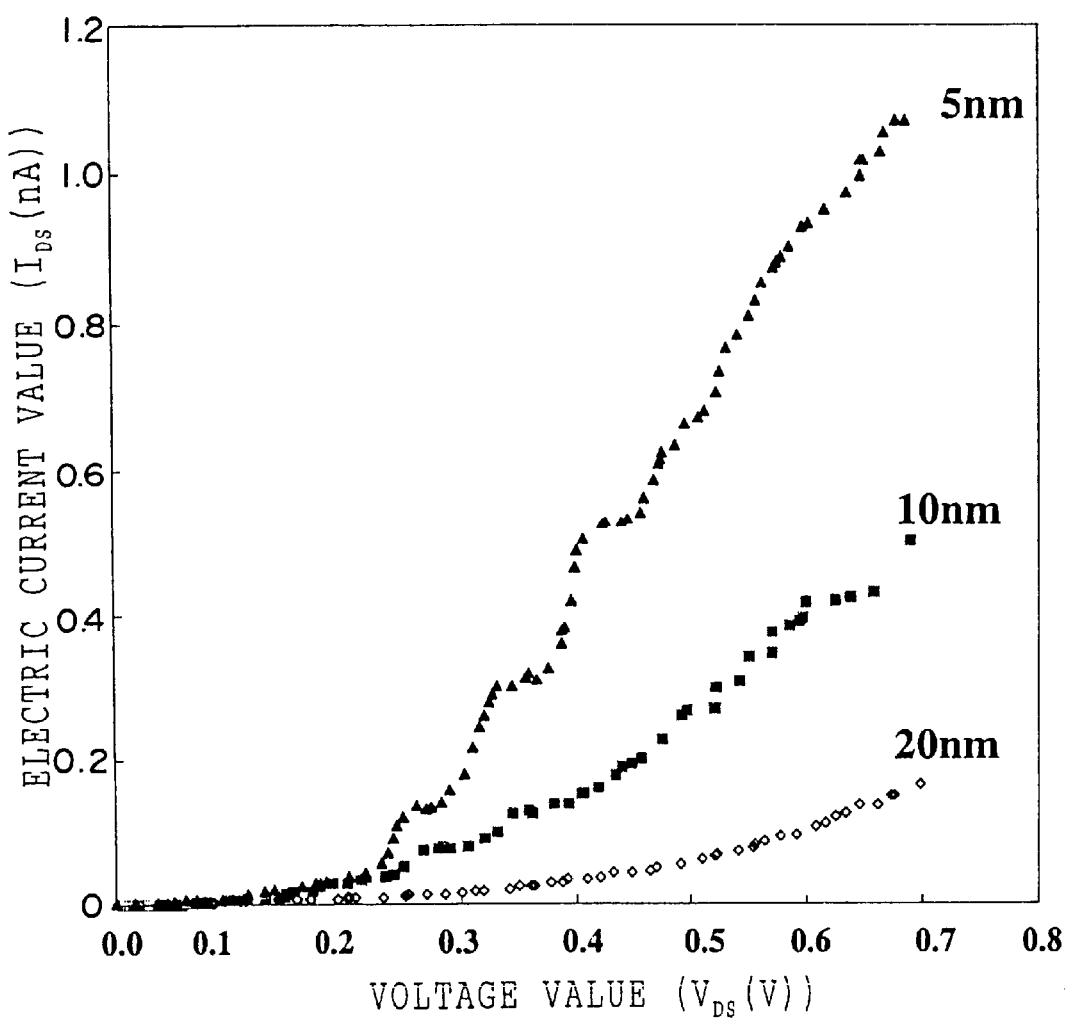
FIG. 7 is a graph showing current-voltage characteristics between a source and a drain with respect to the transistors of Example 1

With respect to three resultant transistor having different gaps between a source electrode and a drain electrode, a current-voltage characteristic between a source and a drain was measured, FIG. 7 is a graph showing current-voltage characteristics between a source and a drain with respect to the transistors. Gate voltage was fixed at 2V, and measurement was carried out at room temperature and in dry nitrogen.

As seen from the graph shown in FIG. 7, it was found that as a gap between a source electrode and a drain electrode became shorter, i.e., 20 nm, 10 nm, and 5 nm, a current value increased. Further, in a transistor having a distance of 5 nm between a source electrode and a drain electrode, as seen from the current-voltage characteristic shown in the graph of FIG. 7, steps which might be It caused by a coulomb blockage phenomenon were confirmed at voltage $V_{DS}$ between a source and a drain of 0.26V, 0.34V, 0.42V and 0.50V. As a result, it was possible to confirm that a transistor of Example 1 operated as a single electron tunneling transistor.

Example 2 and Comparative Example 1

In this Example, same DNA as in Example 1 was used and the same purification treatment as in Example 1 was carried out for the DNA except that a final expansion treatment was omitted. An aggregate formed of a block of DNA molecules was used for fabrication of a transistor. A DNA molecule had 12,000 bases on average forming the DNA molecule. A transistor in which the DNA was used as an insulating material for connect toting against a gate electrode member was fabricated. A nanotube was used as a carrier transporting material.

A multi-wall nanotube (having a length of 3 $\mu$m and a diameter of 10 nm) fabricated by an arc discharge method was used. The nanotube was held on a silicon oxide film on the surface of a retaining substrate as in Example 1. A block of DNA molecules was bonded to the nanotube.

Figure 8:
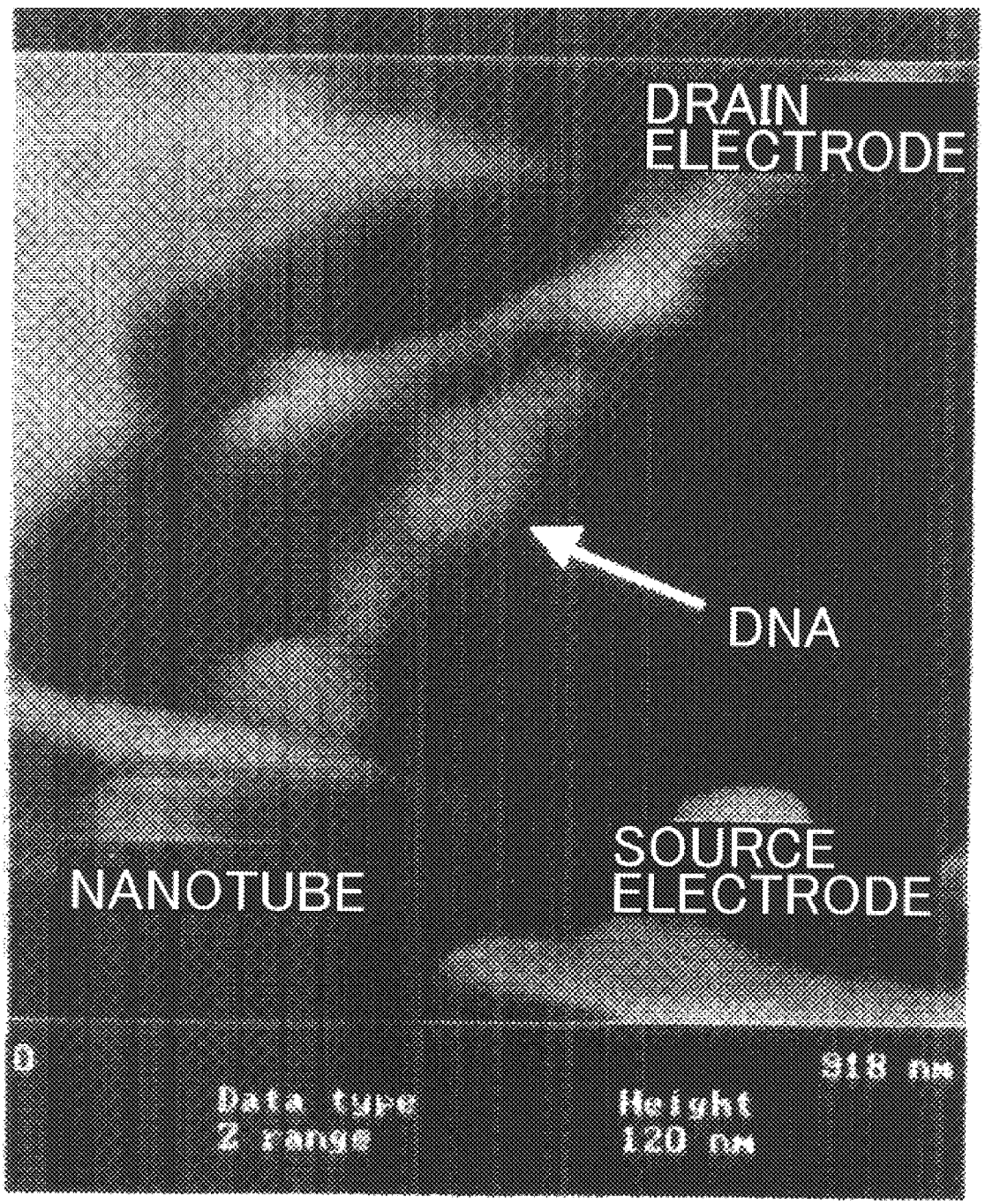
FIG. 8 is an observed AFM image (photograph) in which a source electrode and a drain electrode are wired on a nanotube in a process for fabricating a transistor of Example 2.
Figure 9:
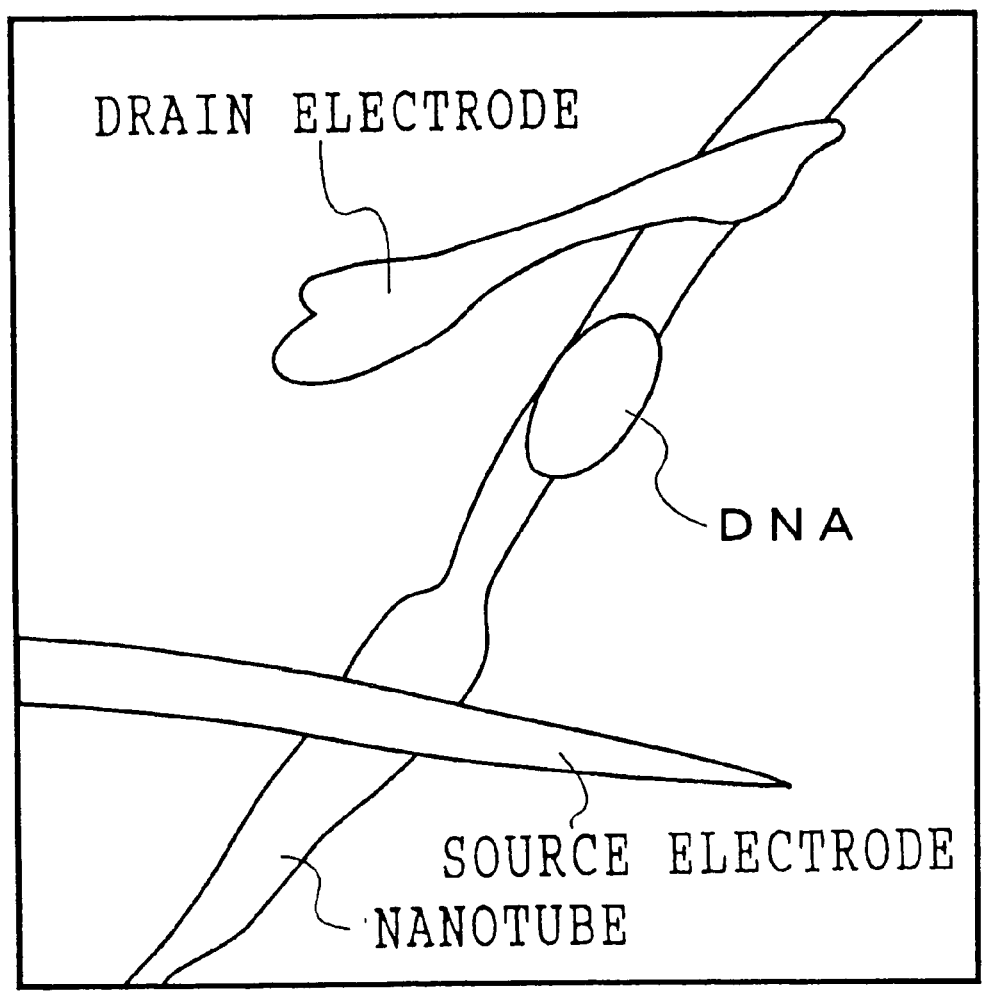
FIG. 9 is a typical explanatory view of FIG. 8, typifying the AFM image (photograph) of FIG. 8.

Electrode members were wired by using a T-AFM as in Example 1. Specifically, two probes made of a multi-wall nanotube (nanotube probes having a diameter of 15 nm) which would become a source electrode member and a drain electrode member were made to connect to ends of a nanotube such that the source electrode and the drain electrode were formed. Then, two multi-wall nanotubes which became the source electrode member and the drain electrode member were cut away from a T-AFM. The source electrode and the drain electrode sandwiched a DNA block. FIG. 8 shows an observed AFM image (photograph) in which a source electrode and a drain electrode are wired on a nanotube. FIG. 9 shows a view typifying FIG. 8. As shown in FIGS. 8 and 9, the source electrode and the drain electrode are connected to a nanotube, and a DNA mass connects to a nanotube serving as a carrier transporting material.

Wiring of a gate electrode was carried out by making a nanotube connect to a DNA mass by using a nanotube AFM probe of a T-AFM. The nanotube which became the gate electrode member was cut away from the AFM probe. In his way, a transistor of Example 2 was fabricated. A transistor of Comparison Example 1 was fabricated for comparison in such a manner that a nanotube was made to connect to the nanotube serving as a carrier transporting material at a position other than the position of the DNA mass.

Figure 10:
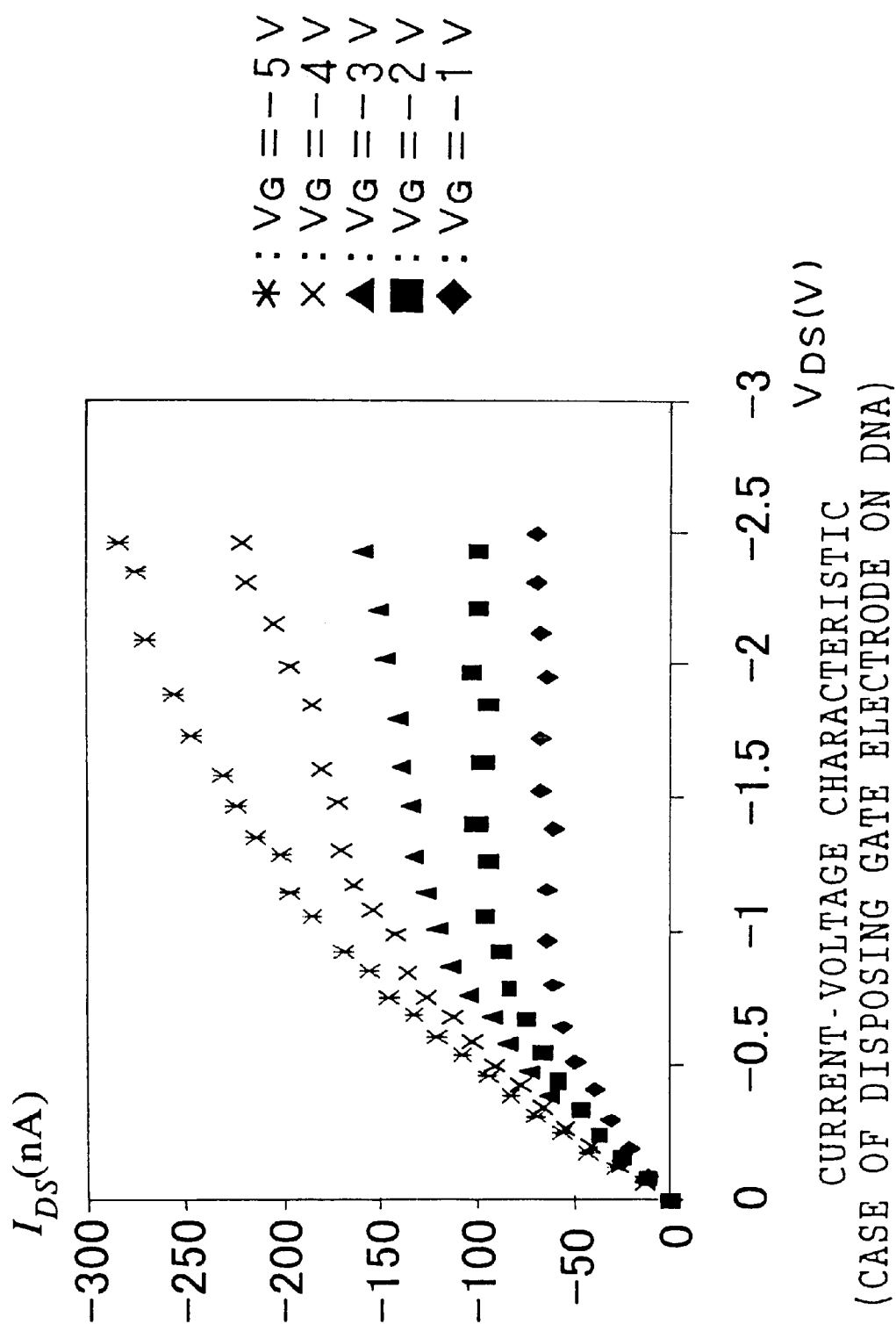
FIG. 10 is a graph showing a current-voltage characteristic between a source and a drain with respect to the transistor of Example 2 with a gate voltage varying in a range of −1V to −5V.
Figure 11:
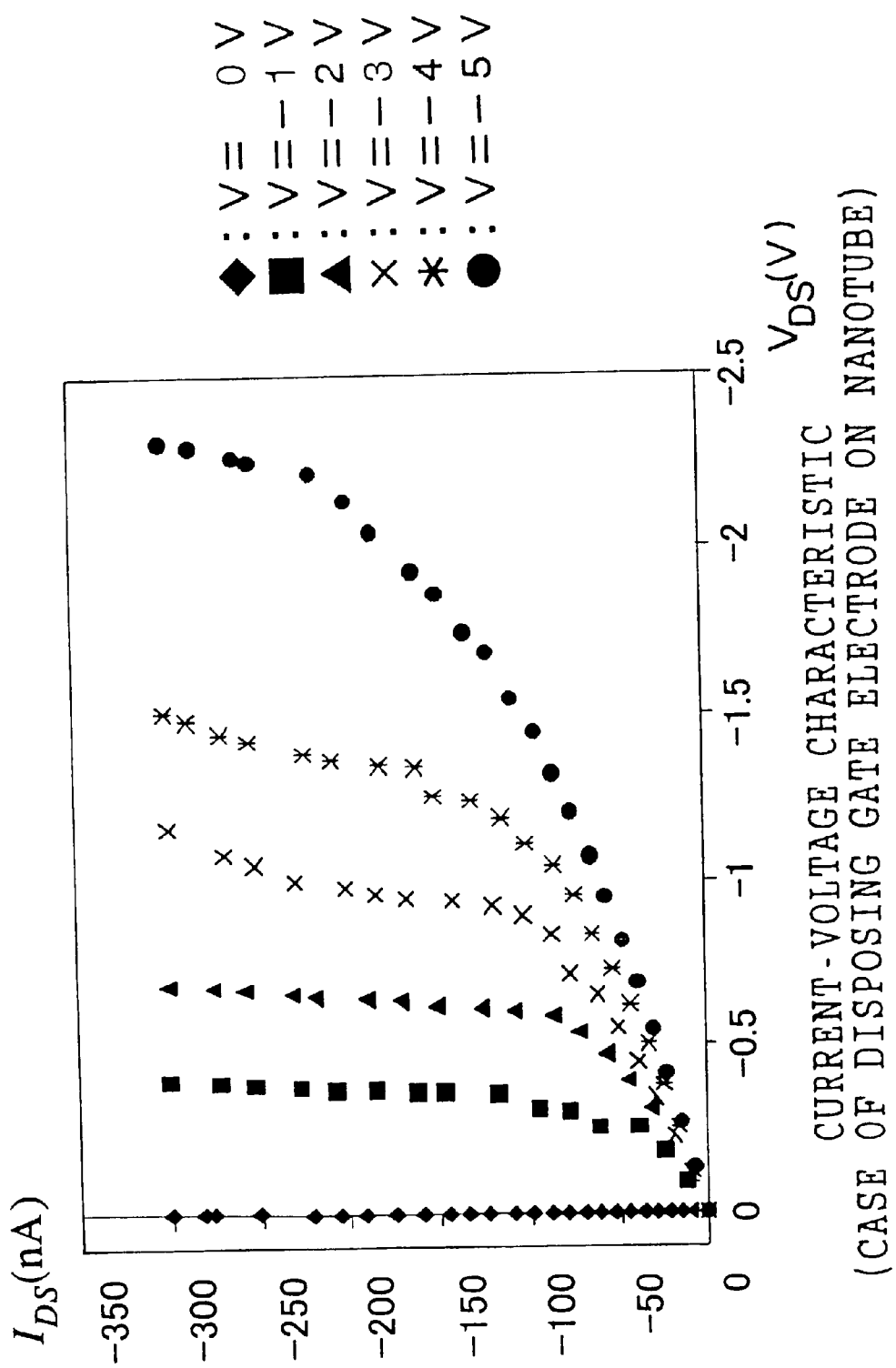
FIG. 11 is a graph showing a current-voltage characteristic between a source and a drain with respect to a transistor of Comparative Example 1 with a gate voltage varying in a range of −1V to −5V.

With respect to resultant resistors, voltage was applied to a gate electrode and a current-voltage characteristic between a source and a drain was measured. FIG. 10 is a graph showing a current-voltage characteristic between a source and a drain of a transistor of Example 2 with gate voltage varying in a rage of 0V to −5V. FIG. 11 is a graph showing a current-voltage characteristic between a source and a drain of a transistor of Comparative Example 1 with gate voltage varying in a range of 0V to −5V.

As shown in FIG. 11, in a case of the transistor of Comparative Example 1 in which gate voltage was applied directly on a nanotube, electric current leaked, the current-voltage characteristic exhibited a triode characteristic, and saturation of a source-drain electric current value did not occur. In contrast, in a case of the transistor of Example 2 in which gate voltage was applied on DNA, there existed a saturation region of a source-drain electric current value, and a substantially perfect field effect transistor could be formed. At this time, a thickness of DNA was found to be 15 nm by calculating from an AFM image.

As described above, in accordance with the present invention, an extremely small transistor which can correspond to significant reduction in the size of an electronic circuit by using DNA for structural materials.

What is claimed is:

1. A transistor comprising:

a source electrode member;

a drain electrode member;

a gate electrode member; and a deoxyribonucleic acid molecule or a deoxyribonucleic acid molecule aggregate;

wherein at least one of said source electrode member, said drain electrode member and said gate electrode member connects to said deoxyribonucleic acid molecule or deoxyribonucleic acid molecule aggregate.

2. The transistor according to claim 1, wherein said deoxyribonucleic acid molecule or deoxyribonucleic acid molecule aggregate acts as a carrier transporting material.

3. The transistor according to claim 2, wherein said electrode members are rod-like shape, and wherein said source electrode member, said gate electrode member and said drain electrode member are arranged in that order in a longitudinal direction of connects of said deoxyribonucleic acid molecule or deoxyribonucleic acid molecule aggregate.

4. The transistor according to claim 3, wherein said gate electrode member has a portion connecting to said deoxyribonucleic acid molecule or deoxyribonucleic acid molecule aggregate, the portion having a width from 0.1 nm to 100 nm.

5. The transistor according to claim 3, wherein a gap between a point where said source electrode member connects to said deoxyribonucleic acid molecule or deoxyribonucleic acid molecule aggregate and a point where said drain electrode member connects to said deoxyribonucleic acid molecule or deoxyribonucleic acid molecule aggregate is 1 nm to 100 nm.

6. The transistor according to claim 2, wherein said deoxyribonucleic acid molecule or deoxyribonucleic acid molecule aggregate has a length of 2 nm to 10 $\mu$m.

7. The transistor according to claim 2, wherein said deoxyribonucleic acid molecule or deoxyribonucleic acid molecule aggregate has 10 or less molecules, and is thread-like or bundle-like.

8. The transistor according to claim 2 which functions as a single electron tunneling transistor.

9. The transistor according to claim 1, wherein said deoxyribonucleic acid molecule or deoxyribonucleic acid molecule aggregate is in a form of mass and connects to said gate electrode member, and acts as an insulating material.

10. The transistor according to claim 9 wherein said deoxyribonucleic acid molecule or deoxyribonucleic acid molecule aggregate is disposed so as to contact a carrier transporting material, said gate electrode member connects to said deoxyribonucleic acid molecule or deoxyribonucleic acid molecule aggregate but does not contact said carrier transporting material, and said source electrode member and said drain electrode member sandwich said deoxyribonucleic acid molecule or deoxyribonucleic acid molecule aggregate and connects to aid carrier transporting material.

11. The transistor according to claim 10, wherein a gap between a point where said source electrode member which connects to said carrier transporting material and a point where said drain electrode member which connects to said carrier transporting material is 1 nm to 1 μm.

12. The transistor according to claim 10, wherein said carrier transporting material is a carbon nanotube.

13. The transistor according to claim 9, wherein a thickness of said mass of said deoxyribonucleic acid molecules or deoxyribonucleic acid molecule aggregate is 2 nm to 100 nm.

14. The transistor according to claim 1, wherein the number of bases composing said deoxyribonucleic acid molecule or a deoxyribonucleic acid molecule of said deoxyribonucleic acid molecule aggregate is 2 to 100,000.

15. The transistor according to claim 1, wherein said gate electrode is a carbon nanotube.

16. The transistor according to claim 1, wherein said source electrode and/or said drain electrode is a carbon nanotube.

* * * * *